(12) United States Patent
Dong et al.

(10) Patent No.: US 8,241,777 B2
(45) Date of Patent: Aug. 14, 2012

(54) BATTERY COVER MECHANISM

(75) Inventors: Shui-Jin Dong, Shenzhen (CN); Wu-Chun Zeng, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 553 days.

(21) Appl. No.: 12/497,748

(22) Filed: Jul. 6, 2009

(65) Prior Publication Data

US 2010/0062323 A1   Mar. 11, 2010

(30) Foreign Application Priority Data

Sep. 11, 2008   (CN) .......................... 2008 1 0304465

(51) Int. Cl.
*H01M 2/10* (2006.01)
*H04B 1/38* (2006.01)
*H05K 5/00* (2006.01)

(52) U.S. Cl. ............ 429/100; 429/96; 429/97; 429/151; 429/175; 455/90.3; 455/347; 455/575.1; 361/679.01

(58) Field of Classification Search ........................ None
See application file for complete search history.

(56) References Cited

U.S. PATENT DOCUMENTS

| 2001/0007823 A1* | 7/2001 | Lee ............................... 455/573 |
| 2007/0026888 A1* | 2/2007 | Zhou ........................... 455/550.1 |

* cited by examiner

*Primary Examiner* — Cynthia Lee
(74) *Attorney, Agent, or Firm* — Altis Law Group, Inc.

(57) ABSTRACT

A battery cover mechanism used in a portable electronic device includes a housing, a releasing assembly and a battery cover. The housing has an assembling surface, an accommodating portion disposed on the assembling surface and at least one latching slot disposed thereon. The battery cover defines a notch therethrough and comprises at least one latch disposed thereon corresponding to the latching slot of the housing for being detachably mounted on the housing. The releasing assembly is releasably assembled within the accommodating portion of the housing and partially accommodated within the notch of the battery cover to release the battery cover from the housing.

15 Claims, 6 Drawing Sheets

BATTERY COVER MECHANISM

CROSS-REFERENCE TO RELATED APPLICATIONS

This application is related to co-pending U.S. patent application Ser. No. 12/497,751, both entitled "BATTERY COVER MECHANISM". Such application has the same assignee as the present application. The above-identified application is incorporated herein by reference.

BACKGROUND

1. Technical Field

The exemplary disclosure generally relates to battery cover mechanisms, and particularly, to a battery cover mechanism used in a portable electronic device.

2. Description of Related Art

Batteries are widely used in portable electronic devices, such as personal digital assistants (PDAs), mobile phones, and so on. Conventional batteries are attachably received in the electronic device, and battery cover mechanisms are designed to connect with housings of the electronic devices to package the batteries, thus the batteries and the inner circuits of the portable electronic devices are protected.

A conventional battery cover mechanism generally includes a cover and a housing. The cover tightly engages with the housing to be secured thereon. However, due to the tight engagement of the cover and the housing in many conventional designs, the user may need to apply a significant amount of force to assemble/disassemble the cover to/from the housing, which can result in the cover and the housing being distorted or damaged.

Therefore, there is room for improvement within the art.

BRIEF DESCRIPTION OF THE DRAWINGS

Many aspects of the battery cover mechanism can be better understood with reference to the following drawings. These drawings are not necessarily drawn to scale, the emphasis instead being placed upon clearly illustrating the principles of the present battery cover mechanism. Moreover, in the drawings like reference numerals designate corresponding sections throughout the several views.

DETAILED DESCRIPTION

Figure 1:
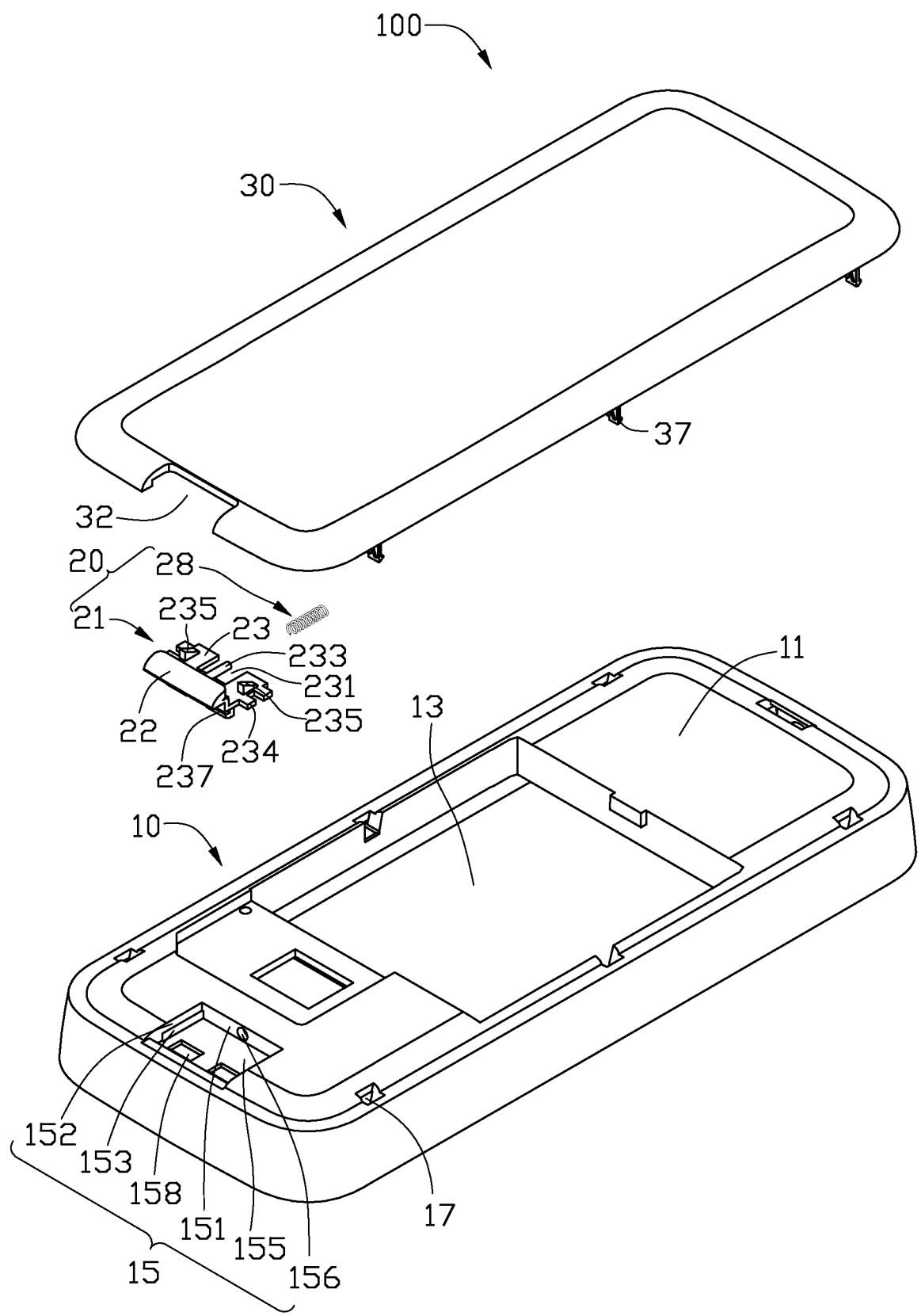
FIG. 1 shows an exploded, perspective view of a battery cover mechanism, in accordance with an exemplary embodiment.
Figure 2:
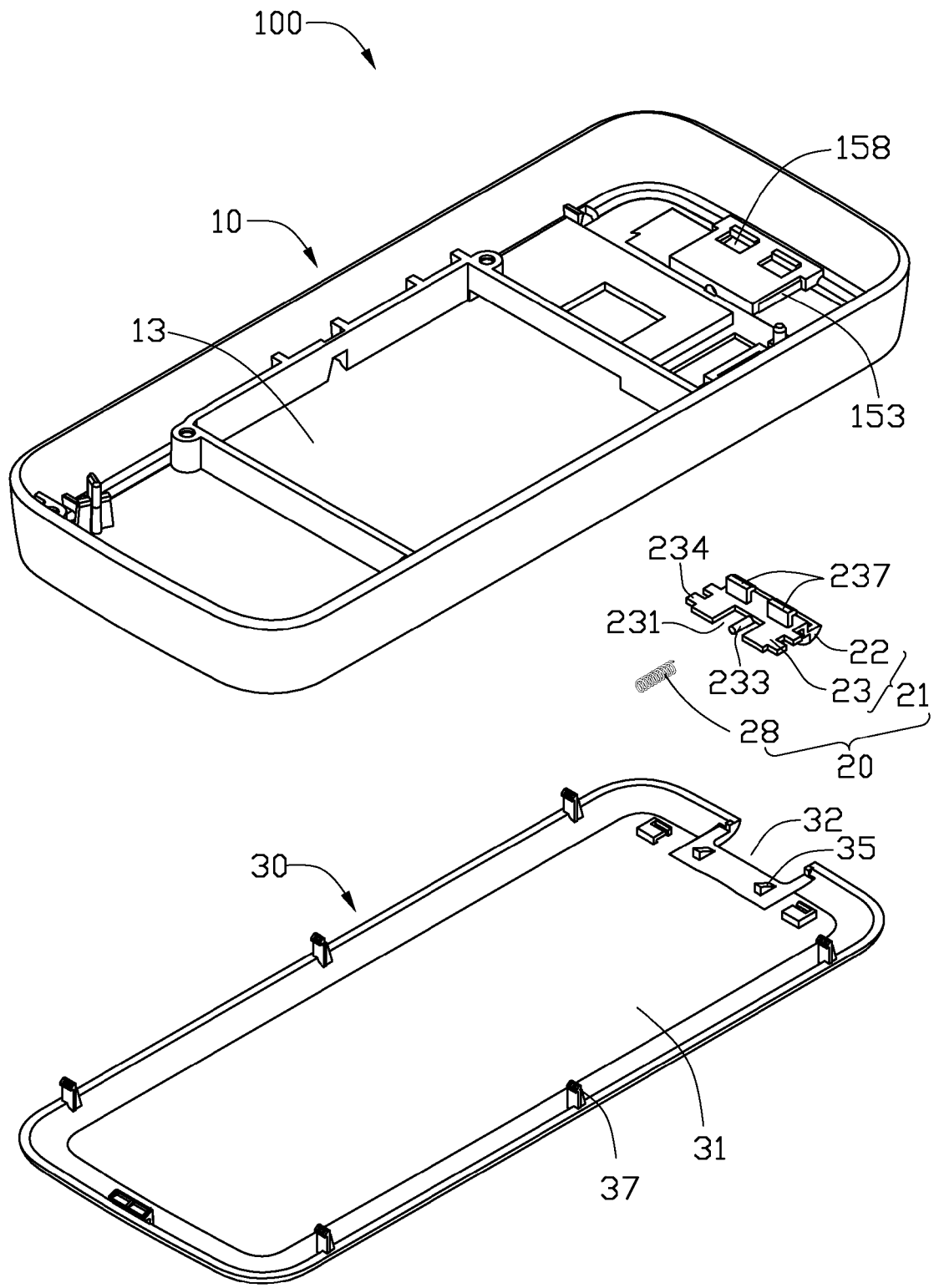
FIG. 2 is similar to FIG. 1, but viewed from another view angle.

Referring to FIG. 1 and FIG. 2, an exemplary battery cover mechanism 100 for portable electronic devices, such as mobile phones, digital cameras etc., is shown. The battery cover mechanism 100 includes a housing 10, a releasing assembly 20, and a batter cover 30 detachably mounted on the housing 10 by the releasing assembly 20.

The housing 10 may be a part of a portable electronic device. The housing 10 includes an assembling surface 11, a receiving compartment 13, an accommodating portion 15, and at least one latching slot 17. The receiving compartment 13 is recessed in the assembling surface 11 of the housing 10 for receiving a battery (not shown) therein. The accommodating portion 15 is disposed on the assembling surface 11 of the housing 10 adjacent to one end thereof for assembling the releasing assembly 20. In the exemplary embodiment, the accommodating portion 15 is recessed in the assembling surface 11 adjacent to the receiving compartment 13. The accommodating portion 15 includes two parallel first sidewalls 151, two parallel second sidewalls 152 connect with the two first sidewalls 151 perpendicularly and a bottom wall 155. The first sidewall 151 adjacent to the receiving compartment 13 defines a blind assembling hole 156 therein at the middle portion thereof. The two second sidewalls 152 both defines a bar shaped sliding slot 153 therein adjacent to the bottom wall 155 opposite to each other. The bottom wall 155 defines at least one latching hole 158 therethrough parallel to the first sidewall 151. In the preferred embodiment, there are two latching holes 158 spacingly defined through the bottom wall 155 parallel to the first sidewall 151. The latching slot 17 is disposed adjacent to the peripheral edge of the assembling surface 11 of the housing 10 for detachably assembling the battery cover 30 to the housing 10. In the exemplary embodiment, there are six spaced latching slots 17 defined in the two longitudinal edges of the assembling surface 11 of the housing 10 respectively.

The releasing assembly 20 is slidably or releasably assembled in the accommodating portion 15 of the housing 10 to latch or release the battery cover 30 to or from the housing 10. The releasing assembly 20 includes a releasing piece 21 and an elastic piece 28. The releasing piece 21 has a substantially L-shaped cross section and is slidably assembled within the accommodating portion 15. The releasing piece 21 includes a pressing portion 22 and an assembling portion 23 extending outwardly from the pressing portion 22. The assembling portion 23 is board shaped and defines a opening 231 therethrough in substantially the middle portion of the distal end opposite to the pressing portion 22. The assembling portion 23 includes a guiding post 233, two guiding blocks 234, at least one resisting block 235, and at least one latching hook 237. The guiding post 233 is substantially cylindrical shaped and protrudes from the assembling portion 23 and is accommodated within the opening 231 corresponding to the blind assembling hole 156 of the accommodating portion 15. The two guiding blocks 234 protrude outwardly from the two sides of the assembling portion 23 respectively and are configured for being slidably assembled in corresponding two sliding slots 153. The resisting block 235 is a substantially wedge shaped block protruding from the assembling portion 23 adjacent to the opening 231. The resisting block 235 has a steeply inclined plane (not labeled) sloping down in the direction away from the pressing portion 22. In the exemplary embodiment, there are two spaced resisting blocks 235 disposed at the assembling portion 23 and positioned near the two sides of the opening 231 respectively. The latching hook 237 is disposed on the assembling portion 23 near the pressing portion 22 end corresponding to the latching hole 158. The latching hook 237 and the resisting block 235 are located at two different sides of the assembling portion 23 respectively. In the exemplary embodiment, there are two spaced latching hooks 237 disposed on the assembling portion 23 near but opposite to the pressing portion 22 for latching with the corresponding two latching holes 158 respectively. The elastic piece 28 is a coil spring and is partially assembled within the assembling hole 156 and wrapped around the guiding post 233 to provide a force to move the pressing portion 22.

The battery cover 30 is detachably mounted on the assembling surface 11 of the housing 10 to cover the receiving compartment 13. The battery cover 30 has a notch 32 defined at one end thereof corresponding to the accommodating portion 15 of the housing 10 and the releasing assembly 20 assembled therewithin. The battery cover 30 includes at least one wedge shaped protrusion 35 and at least one latch 37 disposed on the inner surface 31 thereof corresponding to the resisting block 235 of the releasing piece 21 and the latching slot 17 respectively. In the exemplary embodiment, there are two spaced wedge shaped protrusions 35 disposed at the inner surface 31 of the battery cover 30 adjacent to the notch 32 corresponding to the two resisting blocks 235 of the releasing piece 21. There are six spaced latches 37 protruding from the two longitudinal edges of the inner surface 31 of the battery 30 respectively corresponding to the six latching slots 17 of the housing 10 so as to assemble the battery cover 30 to the housing 10.

Figure 3:
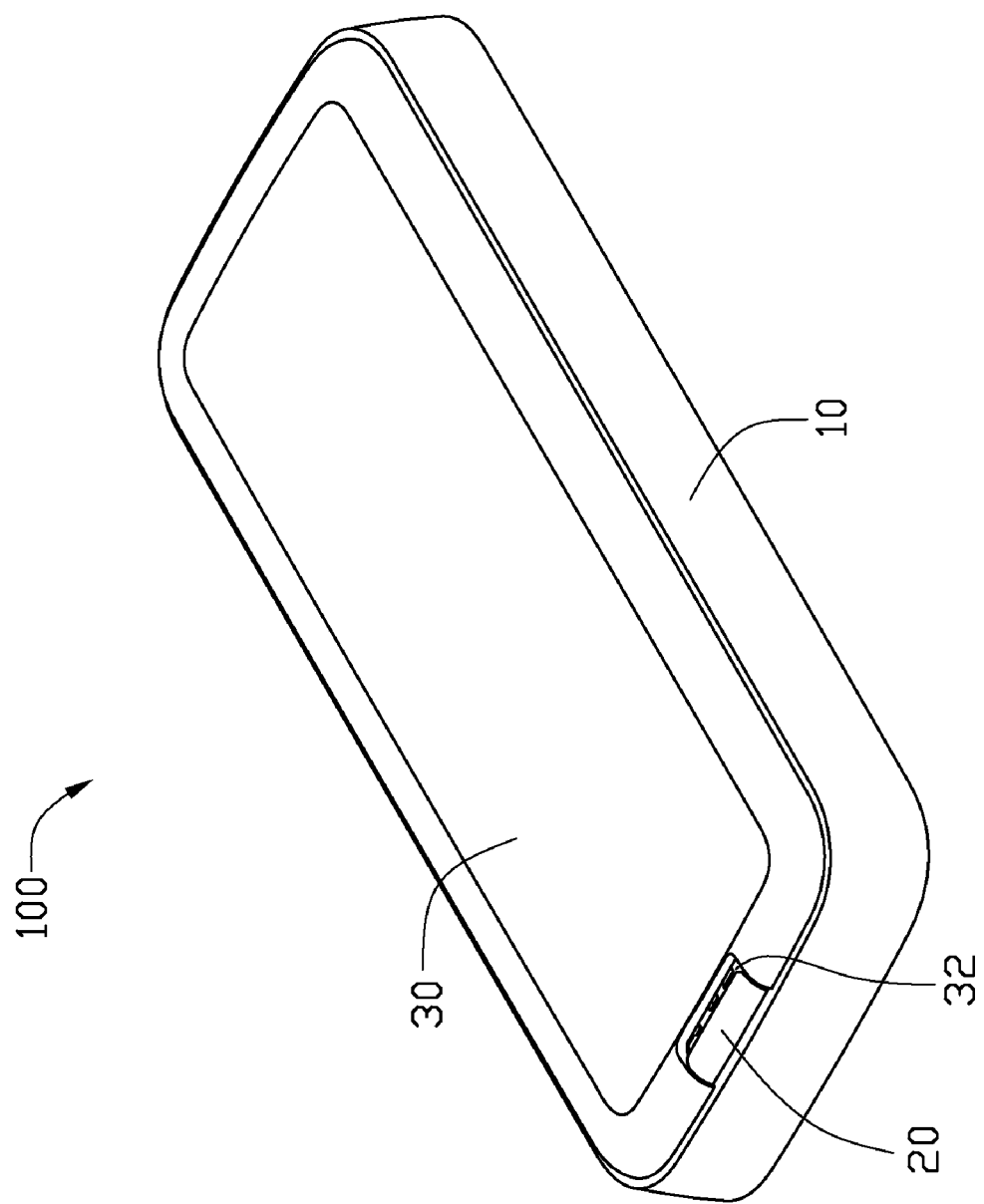
FIG. 3 shows a perspective view of the battery cover mechanism.
Figure 4:
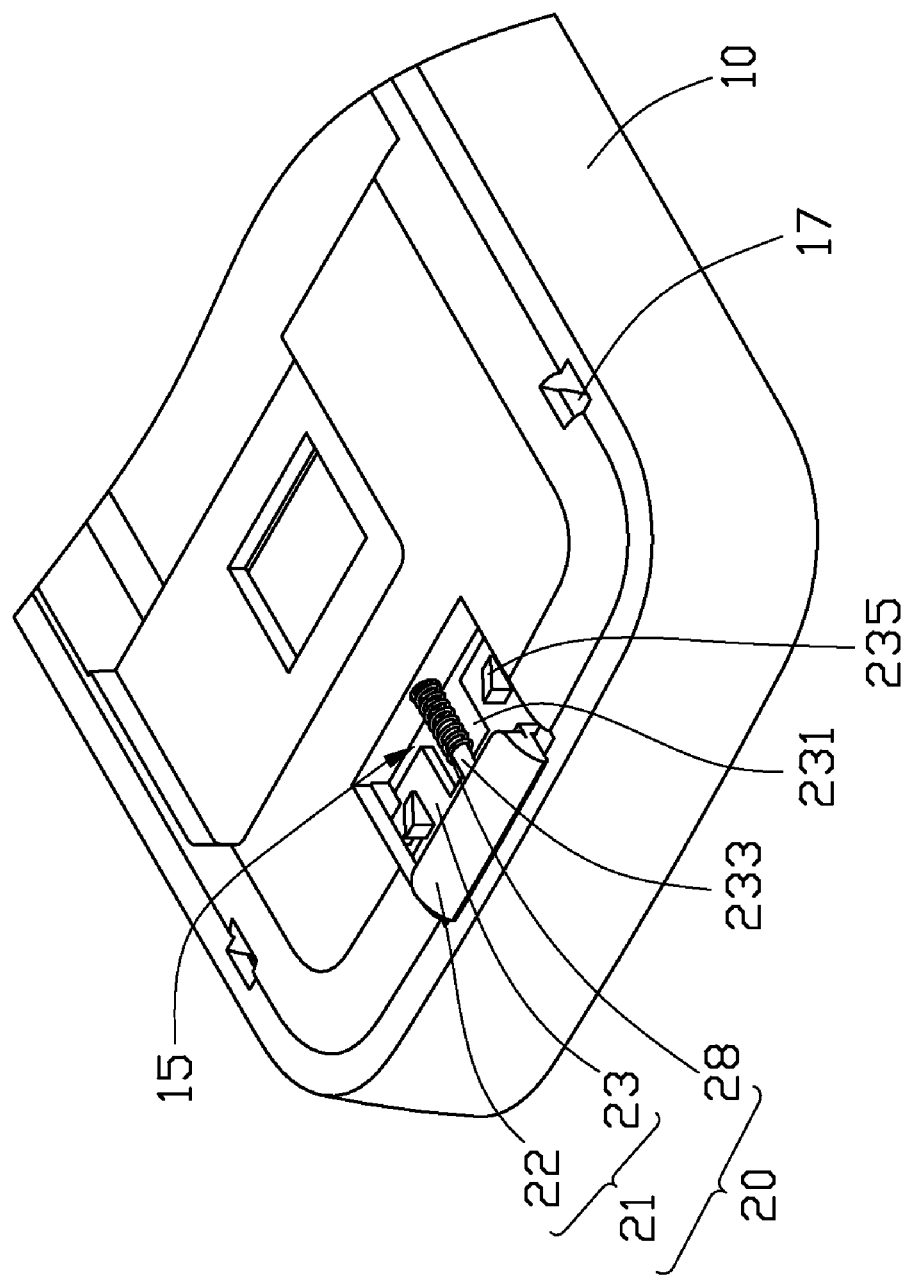
FIG. 4 shows a partial enlarged perspective view of the battery cover mechanism, wherein, the releasing assembly mounted on the housing.
Figure 5:
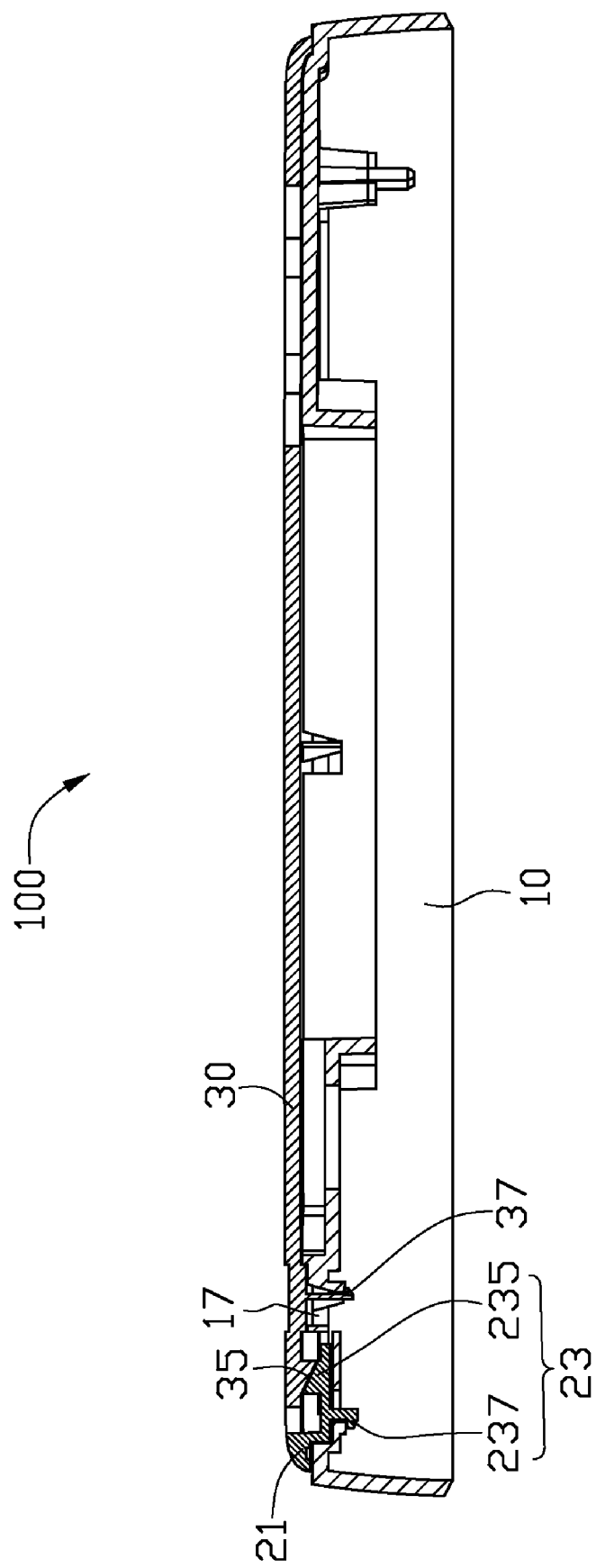
FIG. 5 shows an assembled, cut-away view of the battery cover mechanism shown in FIG. 3, wherein the battery cover mechanism is in a closed mode.

Also referring to the FIGS. 3-5, in assembly, one end of the elastic piece 28 is inserted into the assembling hole 156 of the first sidewall 151 of the accommodating portion 15 of the housing 10. The other end of the elastic piece 28 is exposed from the assembling hole 156 and accommodated with the accommodating portion 15. The releasing piece 21 is slidably assembled within the accommodating portion 15. The guiding post 233 is inserted into the assembling hole 156 and wrapped by the elastic piece 28. The two guiding blocks 234 of the assembling portion 23 are slidably assembled within the corresponding two sliding slots 153 of the two second sidewall 152. The two latching hooks 237 of the assembling portion 23 latch into the corresponding two latching holes 158 respectively. The battery cover 30 is detachably mounted on the assembling surface 11 of the housing 10 to cover the receiving compartment 13. The releasing piece 21 is accommodated within the notch 32 of the battery cover 30. The battery cover 30 is pressed to make the two wedge shaped protrusions 35 resist on the two resisting blocks 235 of the releasing piece 21 respectively and the latches 37 of the battery cover 30 latch with the six latching slots 17 of the housing 10 respectively, thus, the battery cover 30 is assembled to the housing 10.

Figure 6:
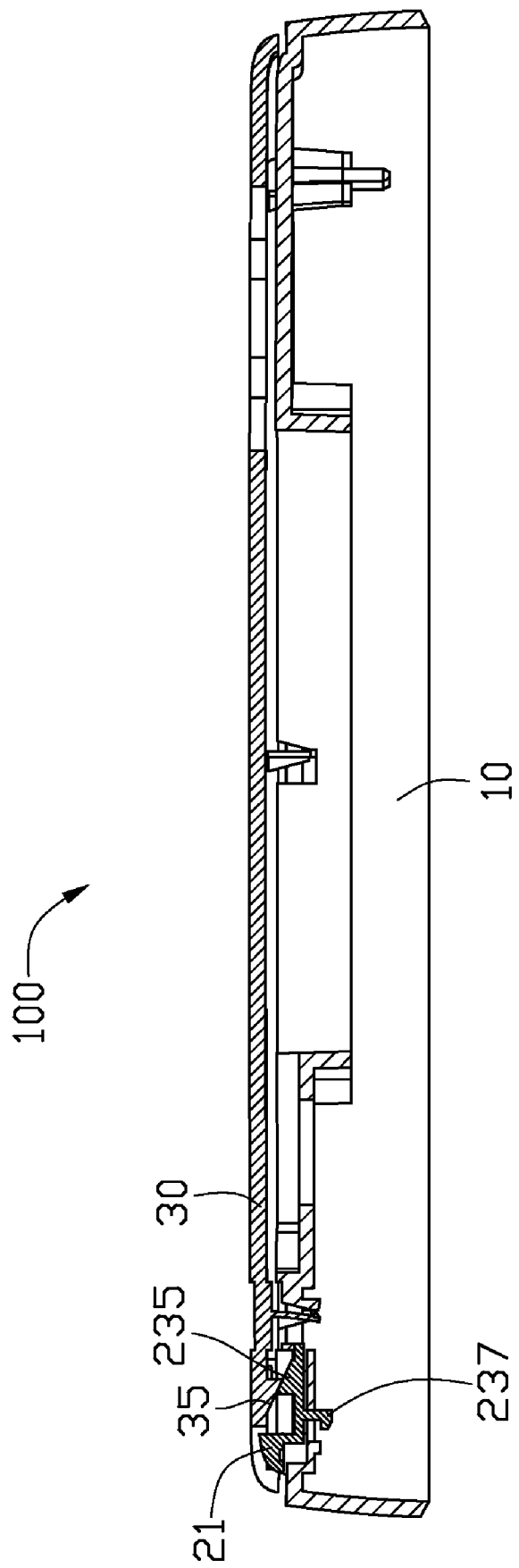
FIG. 6 shows an assembled, cut-away view of the battery cover mechanism in an opened mode.

Also referring to FIG. 6, when the battery cover 30 needs to be detached from the housing 10, the pressing portion 22 of releasing piece 21 is pushed to compress the elastic piece 28 and slide along the sliding slots 153. The two resisting blocks 235 slidably resist on the two resisting blocks 35 of the battery cover 30 respectively to push the battery cover 30 upwardly to detach from the assembling surface 11 of the housing 10. Thus, the latches 37 of the battery cover adjacent to the notch 32 are detached from the corresponding latching slots 17 of the housing 10. Finally, the battery cover 30 is detached from the housing 10 by pulling the battery cover 30 out.

It is to be understood that the elastic piece 28 is not just limited to being a coiled spring, it is also could be a plate shaped spring or other elastic piece.

It is to be understood, however, that even through numerous characteristics and advantages have been set forth in the foregoing description of embodiments, together with details of the structure and functions of the embodiments, the disclosure is illustrative only, and changes may be made in detail, especially in matters of shape, size, and arrangement of sections within the principles of the disclosure to the full extent indicated by the broad general meaning of the terms, in which the appended claims are expressed.

What is claimed is:

1. A battery cover mechanism used in a portable electronic device, comprising:
    a housing having an assembling surface and an accommodating portion disposed on the assembling surface, the accommodating portion defining an assembling hole;
    a battery cover detachably mounted on the housing and defining a notch therethrough; the battery cover comprising a protrusion protruding from the inner surface thereof; and
    a releasing assembly comprising a releasing piece slidably and releasably assembled within the accommodating portion of the housing and accommodated within the notch of the battery cover; the releasing piece includes a wedge shaped resisting block resisting on the corresponding protrusion of the battery cover to detach the battery cover from the housing, the releasing piece including an assembling portion defining an opening, the assembling portion further having a guiding post protruding from the assembling portion and accommodated within the opening, the guiding post slidably inserting into the assembling hole.

2. The battery cover mechanism as claimed in claim 1, wherein the releasing piece includes a pressing portion, and the assembling portion extending outwardly from the pressing portion, the wedge shaped resisting block is disposed on the assembling portion and has an inclined plane backwardly opposite to the pressing portion.

3. The battery cover mechanism as claimed in claim 2, wherein the accommodating portion is recessed from the assembling surface adjacent to one end thereof; the accommodating portion includes a first sidewall defining the assembling hole therein; the assembling portion defines an opening therethrough adjacent to the distal end and opposite to the pressing portion.

4. The battery cover mechanism as claimed in claim 2, wherein the accommodating portion further includes two parallel second sidewalls, the two second sidewalls both defines a sliding slot opposite to each other; the assembling portion further includes two guiding blocks protruding outwardly from the two sides of the assembling portion respectively and configured for slidably assemble with corresponding two sliding slots.

5. The battery cover mechanism as claimed in claim 4, wherein the accommodating portion further includes a bottom wall defining at least one latching hole therethrough parallel to the first sidewall, the assembling portion further includes at least one latching hook disposed on the assembling portion near the pressing portion end for latching with the corresponding latching hole of the bottom wall.

6. The battery cover mechanism as claimed in claim 5, wherein the releasing assembly further includes an elastic piece wrapped around the guiding post and elastically resisted between the releasing piece and the first sidewall to provide a force to make the wedge shaped resisting block resisting on the corresponding wedge shaped protrusion.

7. The battery cover mechanism as claimed in claim 1, wherein the housing further includes at least one latching slot disposed adjacent to the peripheral edge of the assembling surface; the battery cover further includes at least one latch disposed on the inner surface thereof corresponding to the latching slot of the housing for detachably assembling the battery cover to the housing.

8. The battery cover mechanism as claimed in claim 6, wherein the elastic piece is a plate-shaped or coil spring.

9. A battery cover mechanism used in a portable electronic device, comprising:
- a housing having an assembling surface, an accommodating portion disposed on the assembling surface and at least one latching slot disposed thereon, the accommodating portion defining an assembling hole;
- a battery cover defining a notch therethrough and comprising at least one latch disposed thereon corresponding to the latching slot of the housing for being detachably mounted on the housing; and
- a releasing assembly releasably assembled within the accommodating portion of the housing and partially accommodated within the notch of the battery cover to release the battery cover from the housing, the releasing assembly including an assembling portion defining an opening, the assembling portion further having a guiding post protruding from the assembling portion and accommodated within the opening, the guiding post slidably inserting into the assembling hole.

10. The battery cover mechanism as claimed in claim 9, wherein the battery cover comprising two wedge shaped protrusions spacingly disposed at the inner surface thereof adjacent to the notch; the accommodating portion is recessed from the assembling surface adjacent to one end thereof; the releasing assembly includes a releasing piece releasably assembled within the accommodating portion; the releasing piece includes two wedge shaped resisting block spacingly disposed thereon and resists on the corresponding two wedge shaped protrusions of the battery cover respectively.

11. The battery cover mechanism as claimed in claim 10, wherein the releasing piece includes a pressing portion, and the assembling portion extending outwardly from the pressing portion, the two wedge shaped resisting block is spacingly disposed on the assembling portion.

12. The battery cover mechanism as claimed in claim 11, wherein the housing includes a receiving compartment recessed from the assembling surface thereof for receiving a battery therein; the accommodating portion includes two parallel first sidewalls, two parallel second sidewalls connect with the two first sidewalls perpendicularly and a bottom wall; the two second sidewalls both defines a sliding slot therein adjacent to the bottom wall opposite to each other; the assembling portion includes two guiding blocks protruding outwardly from the two sides of the assembling portion respectively and configured for slidably assemble with corresponding two sliding slots.

13. The battery cover mechanism as claimed in claim 12, wherein one first sidewall adjacent to the receiving compartment defines the assembling hole therein; the assembling portion defines an opening therethrough adjacent to the distal end and opposite to the pressing portion.

14. The battery cover mechanism as claimed in claim 13, wherein the bottom wall defines two spaced latching holes therethrough parallel to the first sidewall; the assembling portion further includes two spaced latching hooks disposed on the assembling portion near the pressing portion end for latching with the corresponding two latching holes of the bottom wall respectively.

15. The battery cover mechanism as claimed in claim 14, wherein the releasing assembly further includes an elastic piece wrapped around the guiding post and elastically resisted between the releasing piece and the first sidewall to provide a force to move the pressing portion.

* * * * *